(12) United States Patent
Miyauchi et al.

(10) Patent No.: US 7,688,077 B2
(45) Date of Patent: Mar. 30, 2010

(54) TEST SYSTEM AND DAUGHTER UNIT

(75) Inventors: Kouji Miyauchi, Tokyo (JP); Toshiyuki Watanabe, Tokyo (JP)

(73) Assignee: Advantest Corporation (JP)

( * ) Notice: Subject to any disclaimer, the term of this patent is extended or adjusted under 35 U.S.C. 154(b) by 272 days.

(21) Appl. No.: 11/843,672

(22) Filed: Aug. 23, 2007

(65) Prior Publication Data

US 2009/0051366 A1    Feb. 26, 2009

(51) Int. Cl.
*G01R 31/02* (2006.01)
*G01R 31/26* (2006.01)
(52) U.S. Cl. .................. 324/537; 324/765
(58) Field of Classification Search .......... 324/537, 324/500, 765, 760, 754, 538
See application file for complete search history.

(56) References Cited

U.S. PATENT DOCUMENTS

| | | | | |
|---|---|---|---|---|
| 5,475,316 | A  * | 12/1995 | Hurley et al. | 324/750 |
| 6,313,653 | B1 * | 11/2001 | Takahashi et al. | 324/760 |
| 6,377,062 | B1 * | 4/2002 | Ramos et al. | 324/758 |
| 6,507,203 | B1 * | 1/2003 | Hirschmann | 324/754 |
| 6,759,842 | B2 * | 7/2004 | Weimer | 324/158.1 |
| 7,479,795 | B2 * | 1/2009 | Hayashi et al. | 324/760 |
| 7,534,654 | B2 * | 5/2009 | Pedersen et al. | 438/110 |

FOREIGN PATENT DOCUMENTS

| | | |
|---|---|---|
| JP | H07-260878 | 10/1995 |
| JP | H10-142291 | 5/1998 |
| JP | H11-083934 | 3/1999 |
| JP | 2000-121704 | 4/2000 |

* cited by examiner

*Primary Examiner*—Hoai-An D Nguyen
(74) *Attorney, Agent, or Firm*—Chen Yoshimura LLP

(57) ABSTRACT

Provided is a test system that tests a device under test, the test system including: a test head that includes a test module that generates a test signal to be supplied to the device under test; a performance board that is mounted above the test head and conveys the test signal generated by the test module; and a daughter unit that is detachably mounted to the performance board, and conveys the test signal from the performance board to the device under test, where the daughter unit includes: a socket to which the device under test is mounted; a daughter board to which the socket is mounted; and an enclosure that accommodates therein the socket and the daughter board, and includes a daughter-unit shield that cuts off noise from outside with respect to the socket and the daughter board.

19 Claims, 13 Drawing Sheets

US 7,688,077 B2

TEST SYSTEM AND DAUGHTER UNIT

BACKGROUND

1. Technical Field

The present invention relates to a test system and a daughter unit. In particular, the present invention relates to a test system and a daughter unit for testing a device under test.

2. Related Art

A test apparatus for testing a semiconductor and the like includes a test head including a test module outputting a test signal, and a performance board mounted above the test head. The performance board, to which the device under test is mounted, conveys a test signal outputted from the test module to the device under test.

In addition, such a test apparatus sometimes includes a relay board between the performance board and the device under test. Such a test apparatus is able to mount semiconductors of a plurality of kinds to a common performance board.

For example, when testing a high frequency device for use in high-speed wireless communication, it is desirable that a test apparatus performs the test by cutting off electromagnetic noise incident from outside. However, by using a performance board, it is not possible to cut off electromagnetic noise incident from outside. Likewise, by using a relay board, it is not possible to cut off electromagnetic noise incident from outside. As a result, it is difficult for a test apparatus to test a high frequency device with accuracy, by cutting off electromagnetic noise incident from outside.

SUMMARY

In view of this, it is an object of one aspect of the innovations herein to provide a test system and a daughter unit that are capable of solving the foregoing problems. This object is achieved by combinations of features described in the independent claims. The dependent claims define further advantageous and concrete examples of the present invention.

According to the first aspect related to the innovations herein, one exemplary test system is a test system that tests a device under test, the test system including: a test head that includes a test module that generates a test signal to be supplied to the device under test; a performance board that is mounted above the test head and conveys the test signal generated by the test module; and a daughter unit that is detachably mounted to the performance board, and conveys the test signal from the performance board to the device under test, where the daughter unit includes: a socket to which the device under test is mounted; a daughter board to which the socket is mounted; and an enclosure that accommodates therein the socket and the daughter board, and includes a daughter-unit shield that cuts off noise from outside with respect to the socket and the daughter board.

According to a second aspect related to the innovations herein, one exemplary daughter unit is a daughter unit detachably mounted to a performance board included in a test system, the test system including a test head that includes a test module that generates a test signal to be supplied to a device under test and the performance board that is mounted above the test head and conveys the test signal generated by the test module, the daughter unit conveying the test signal from the performance board to the device under test, the daughter unit including: a socket to which the device under test is mounted; a daughter board to which the socket is mounted; and an enclosure that accommodates therein the socket and the daughter board, and includes a daughter-unit shield that cuts off noise from outside with respect to the socket and the daughter board.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
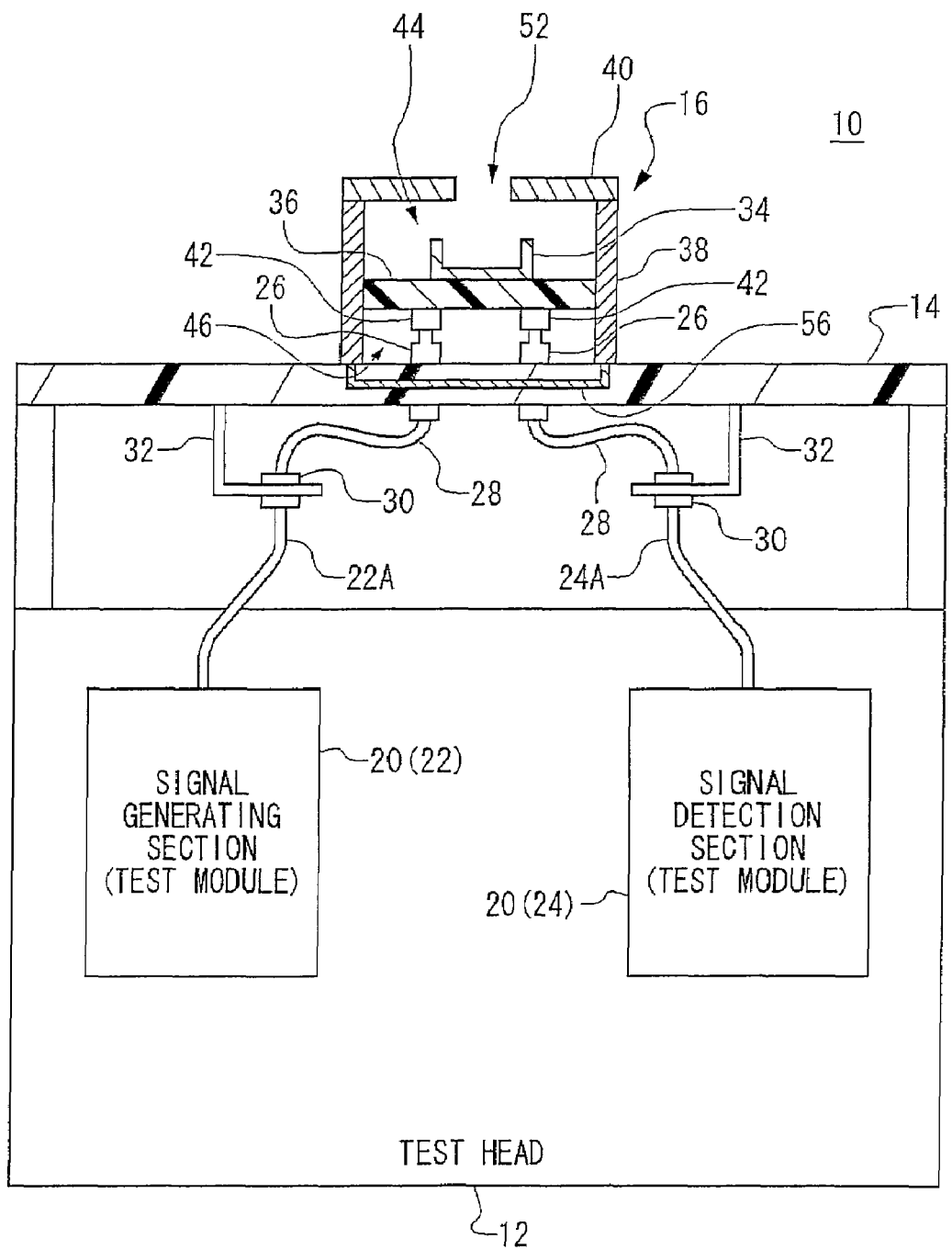
FIG. 1 shows a configuration of a test system 10 according to the present embodiment to which a device 300 under test is not mounted.
Figure 2:
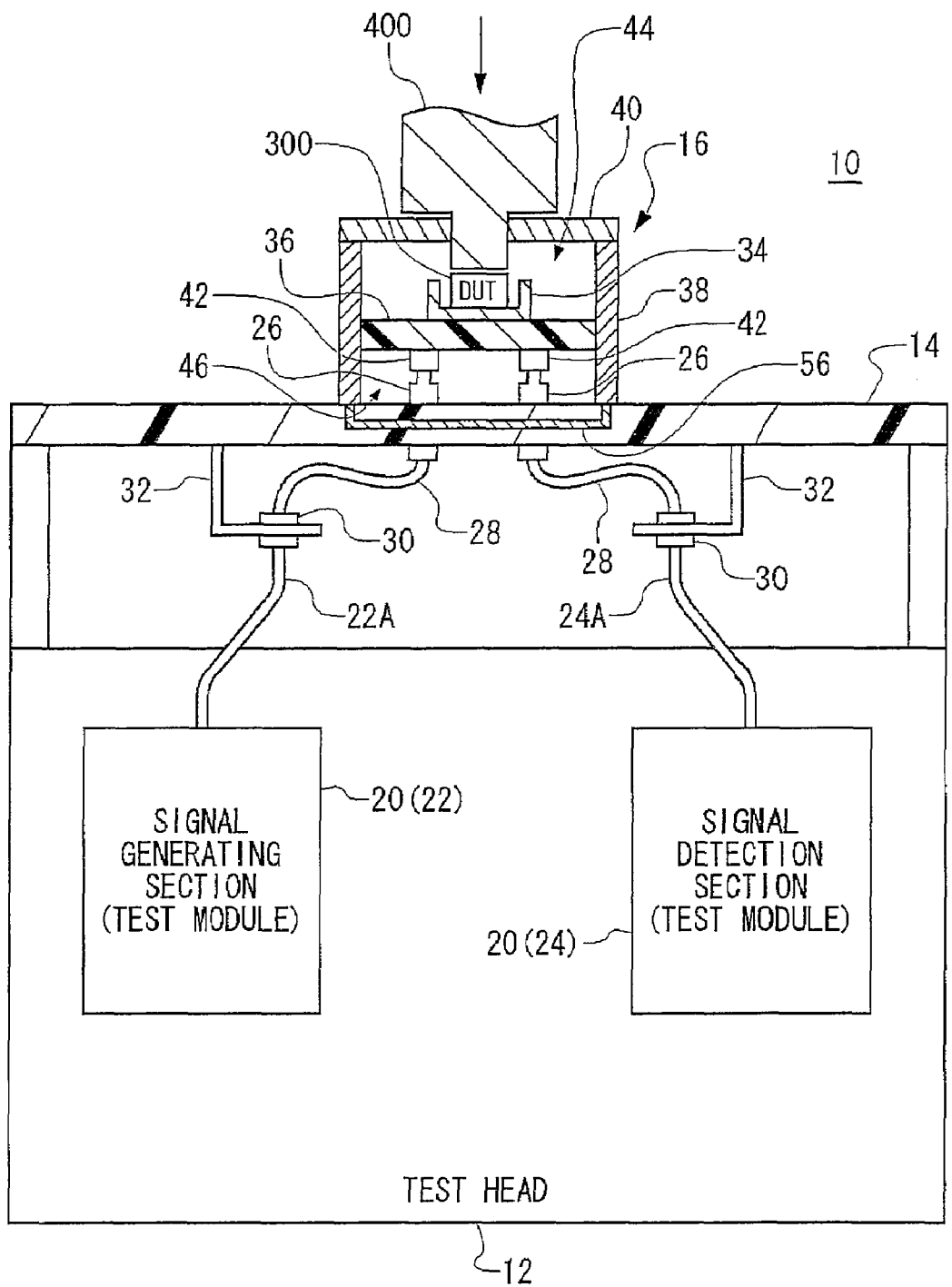
FIG. 2 shows a configuration of a test system 10 according to the present embodiment to which a device 300 under test is mounted.

FIG. 1 shows a configuration of a test system 10 according to the present embodiment to which a device 300 under test is not mounted. FIG. 2 shows a configuration of a test system 10 according to the present embodiment to which a device 300 under test is mounted.

A test system 10 tests a device 300 under test (DUT 300). The test system 10 may test a high frequency device for high-speed wireless communication as a device 300 under test. The test system 10 includes a test head 12, a performance board 14, and a daughter unit 16.

A test head 12 includes a test module 20 generating a test signal to be supplied to the device 300 under test. Furthermore, the test head 12 may also include a test module 20 receiving an output signal outputted from the device 300 under test. In the present embodiment, the test head 12 includes, as test modules 20, a signal generating section 22 that generates an arbitrary test signal of an analogue waveform, and a signal detection section 24 that digitalizes an analogue output signal outputted from the device 300 under test.

The performance board 14 is mounted above the test head 12. The performance board 14 conveys a test signal generated by the test modules 20, to the daughter unit 16. Furthermore, the performance board 14 may convey an output signal from the device 300 under test, from the daughter unit 16 to the test module 20.

In addition, in the present embodiment, the performance board 14 includes at least one performance-board connector 26 on its upper surface. The performance-board connector 26 supplies a test signal to the daughter unit 16, by being connected to the daughter-board connector 42 detailed later. Furthermore, the performance-board connector 26 may receive an output signal from the daughter board 16, by being connected to the daughter-board connector 42.

In addition, in the present embodiment, the performance board 14 includes RF cables 28, RF joint sections 30, and L-shape supporting sections 32, provided in association with the performance-board connectors 26 respectively. One end of an RF cable 28 is connected to a corresponding performance-board connector 26. An RF joint section 30 links the end of a corresponding RF cable 28 that is not connected to a performance-board connector 26, and the output end (or the input end) of an output cable 22A (or an input cable 24A) of the signal generating section 22 (or the signal detection section 24). The L-shape supporting sections 32 are provided on a lower surface of the performance board 14, and support the RF joint sections 30. Such a performance board 14 is able to supply a test signal of a high frequency outputted from the signal generating section 22 to the daughter unit 16 via the performance-board connector 26. Furthermore, such a performance board 14 is able to convey an output signal of a high frequency received via the performance-board connector 26 to the signal detection section 24.

A device 300 under test is mounted to the daughter unit 16. Furthermore, the daughter unit 16 is mounted detachably on the performance board 14. The daughter unit 16 conveys a test signal from the performance board 14 to the device 300 under test, in the state in which the device 300 under test is mounted to the daughter unit 16 and the daughter unit 16 is mounted to the performance board 14. Further, the daughter unit 16, in above-mentioned state, may convey an output signal from the device 300 under test to the performance board 14.

Such a daughter unit 16 includes a socket 34, a daughter board 36, and an enclosure 38. In addition, the daughter unit 16 may further include a top panel 40.

The device 300 under test is mounted to the socket 34. Here, in the present embodiment, a chuck 400 of a handler apparatus mounts the device 300 under test to the socket 34. In more detail, the chuck 400 of the handler apparatus takes out the device 300 under test from a cartridge within the handler apparatus, and moves the device 300 under test to immediately above the socket 34 by holding the device 300 under test having been taken out. Then the chuck 400 of the handler apparatus moves the device 300 under test in the direction of the arrow in FIG. 2 (e.g. from the above to the below), to push the device 300 under test into the socket 34. As a result, the device 300 under test is successfully mounted to the socket 34.

The socket 34 is mounted to the upper surface of the daughter board 36. The daughter board 36 may be a thin plate having a rectangular main surface.

In addition, in the present embodiment, the daughter board 36 includes daughter-board connectors 42 at the lower surface, which are provided corresponding to the performance-board connectors 26. A daughter-board connector 42, by being connected to a corresponding performance-board connector 26 in a state where the daughter unit 16 is mounted to the performance board 14, receives a test signal supplied from the performance-board connector 26. Furthermore, the daughter-board connector 42 supplies an output signal outputted from the device 300 under test to the performance-board connector 26, by being connected to a corresponding performance-board connector 26 in a state where the daughter unit 16 is mounted to the performance board 14. The daughter board 36 connects respective daughter-board connectors 42 to the socket 34.

The enclosure 38 stores the socket 34 and the daughter board 36 therein. Then the enclosure 38 cuts off electromagnetic noise incident to the socket 34 and the daughter board 36 from outside. The enclosure 38 may be a conductive member such as metal, for example. Note that the enclosure 38 may cover or surround a part of the socket 34 and the daughter board 36. In other words, the enclosure 38 may cut off a part of the electromagnetic noise incident to the socket 32 and the daughter board 36.

In addition, the enclosure 38 includes an upper opening 44 in the direction of the chuck 400 of the handler apparatus (i.e. the upper direction). Such an enclosure 38 exposes the upper surface of the daughter board 36 to outside, from the upper opening 44. Furthermore, the enclosure 38 includes a lower opening 46 in the direction of the performance board 14 (i.e. the lower direction). Such an enclosure 38 exposes the lower surface of the daughter board 36 from the lower opening 46 to outside. Such an enclosure 38 facilitates adjustment, exchange, and the like of the device mounted to the daughter board 36.

The enclosure 38 is for example formed as a tube whose inner radius has substantially the same form as the form of the main surface of the daughter board 36 (e.g. rectangular form). In addition, the enclosure 38 for example may accommodate therein the daughter board 36 whose main surface is aligned in a vertical direction with respect to the center axis of the tube. The enclosure 38, in the state where the daughter unit 16 is mounted to the performance board 14, may be aligned so that one opening of the tube faces the performance board 14 and the other opening thereof faces the chuck 400 of the handler apparatus.

The top panel 40 closes the upper opening 44 of the enclosure 38. As one example, the top panel 40 may be a thin plate having a larger main surface than the upper opening 44. The top panel 40 cuts off the electromagnetic noise incident to the inside of the daughter unit 16 via the upper opening 44 from outside. The top panel 40 may be a conductive member such as metal, for example.

Furthermore, the top panel 40 has a chuck opening 52, which is at least larger than the device 300 under test, in a position corresponding to the socket 34. According to this, the chuck 400 of the handler apparatus may move the device 300 under test to inside the daughter unit 16 via the chuck opening 52, to mount the device 300 under test to the socket 34.

In addition, in the present embodiment, the performance board 14 further includes a performance-board shield 56. The performance-board shields 56 shields the lower opening 46 of the enclosure 38, in the state where the daughter unit 16 is mounted to the performance board 14. In other words, the performance-board shield 56 cuts off electromagnetic noise incident to the inside of the daughter unit 16 via the lower opening 46 from outside. The performance-board shield 56 may be a conductive layer provided in an area corresponding to the lower opening 46 in the state where the daughter unit 16 is mounted to the performance board 14.

In the test system 10 having the above-stated configuration, the enclosure 38 of the daughter unit 16 cuts off the electromagnetic noise incident to the device 300 under test from outside. Accordingly, according to the test system 10, it is possible to test the device 300 under test with accuracy.

Furthermore, the performance-board shield 56 shields the lower opening 46 of the enclosure 38. According to this arrangement, according to the test system 10, it is possible to cut off more electromagnetic noise given to the device 300 under test via the lower opening 46 from outside. Furthermore, the top panel 40 shields the upper opening 44 of the enclosure 38. According to this arrangement, according to the test system 10, it is possible to cut off more electromagnetic noise incident to the device 300 under test via the upper opening 44 from outside. As a result, according to the test system 10, it is possible to test a device 300 under test, with increased accuracy.

In addition, the test system 10 may test the device 300 under test, in the state in which the chuck 400 of the handler apparatus is inserted to inside the daughter unit 16 via the chuck opening 42 of the top panel 40. According to this arrangement, according to the test system 10, the chuck 400 of the handler apparatus is able to shield the chuck opening 52, thereby cutting off more electromagnetic noise incident to the chuck opening 52 from outside. According to this arrangement, according to the test system 10, it is possible to test the device 300 under test with increased accuracy.

Note that the top panel 40 may be placed so that the surrounding portion of the chuck opening 52 on the upper surface is in close contact with the handler apparatus without any space therebetween, when the chuck 400 of the handler apparatus mounts the device 300 under test to the socket 34. According to this, according to the test system 10, it is possible to cut off more electromagnetic noise. Furthermore, a hollow conductive gasket may be provided in a surrounding portion of the chuck opening 52 on the upper surface of the top panel 40. Accordingly, the top panel 40 is able to be in closer contact with the handler apparatus.

In addition, the performance-board connector 26 may be a terminal having a pogo structure. The daughter-board connector 42 to be connected to the performance-board connector 26 may be a terminal having a structure connectable to the pin having the pogo structure. By an arrangement so that the tip of the performance-board connector 26 is in contact with the daughter-board connector 42, the performance-board connector 26 is electrically connected to the daughter-board connector 42. Furthermore, the performance-board connector 26 may be designed so that the tip thereof is resilient in the axial direction, for example. In other words, such a performance-board connector 26 is provided in a position corresponding to the lower opening 46 in the state where the daughter unit 16 is mounted to the performance board 14, and is connected to the daughter-board connector 42 by being elongated towards the daughter unit 16 from the upper surface of the performance board 14.

According to this, according to the test system 10, it is possible to easily detach the daughter unit 16 from the performance board 14. Furthermore, according to the test system 10, it is possible to assuredly convey a test signal from the performance board 14 to the daughter unit 16, and to assuredly convey an output signal from the daughter unit 16 to the performance board 14. Note that instead of the above, the test system 10 may include a daughter-board connector 42 having a pogo structure, and a performance-board connector 26 having a construction connectable to a pin having the pogo structure.

In addition, a device operating according to a high-frequency signal may be mounted to the upper surface of the daughter board 36, for example. Furthermore, a device (e.g. logic circuit) operating according to a low-frequency signal may be mounted to the lower surface of the daughter board 36, for example. According to such a test system 10, it is possible to reduce the amount of electromagnetic noise incident to a high-frequency device mounted to the daughter board 36, from among the electromagnetic noise leaked from the connection point between the performance-board connector 26 and the daughter-board connector 42.

In addition, according to such a test system 10, for testing a plurality of kinds of devices 300 under test, a performance board 14 common to the plurality of kinds of devices 300 under test may be created. As a result, according to the test system 10, when a new device 300 under test is added for testing, it is possible to reduce the manufacturing cost because creation of a new performance board 14 is unnecessary if a corresponding daughter unit 16 is created.

Figure 3:
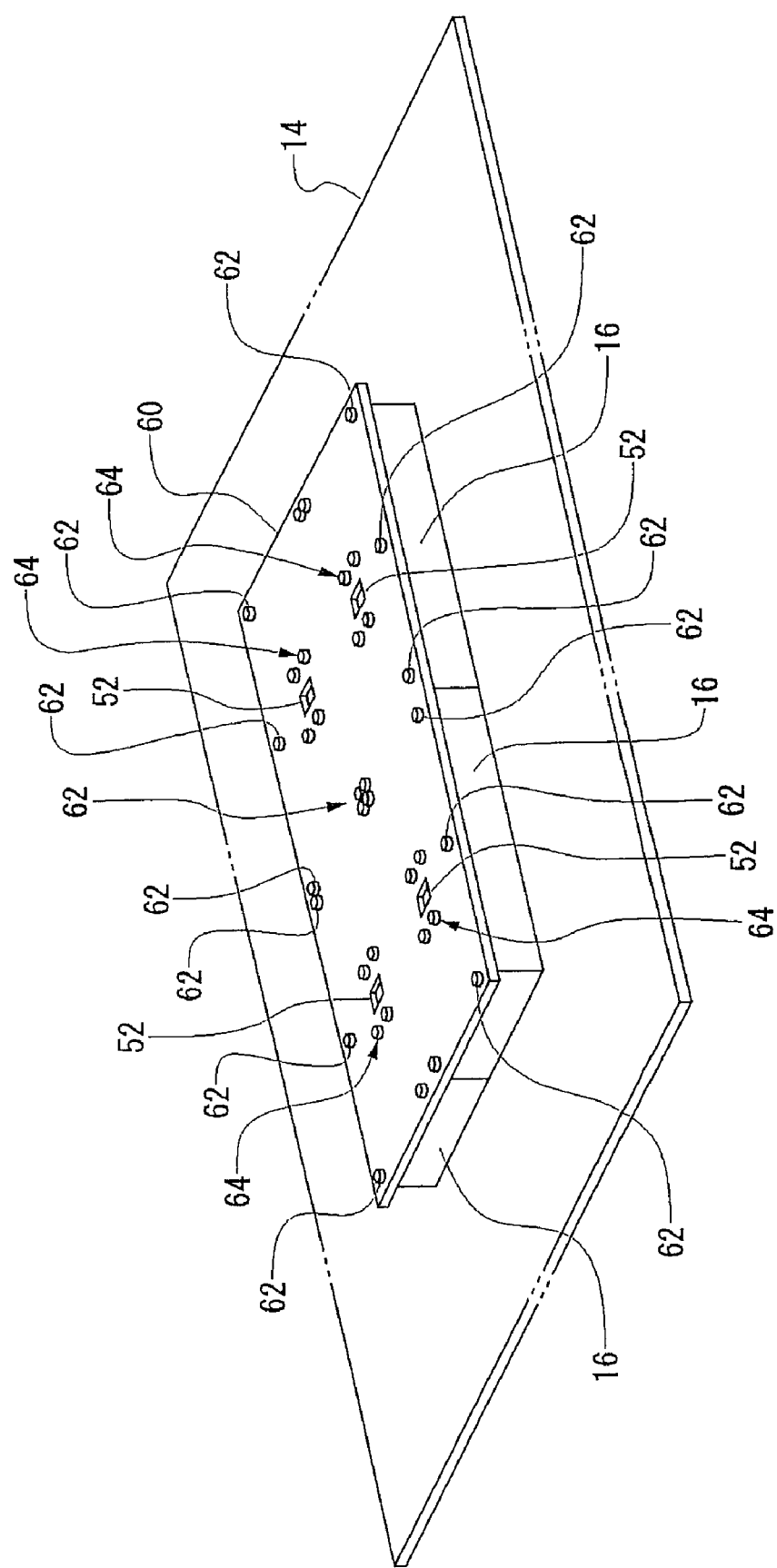
FIG. 3 shows a performance board 14 to which a daughter unit 16 and a common top panel 60 are mounted.
Figure 4:
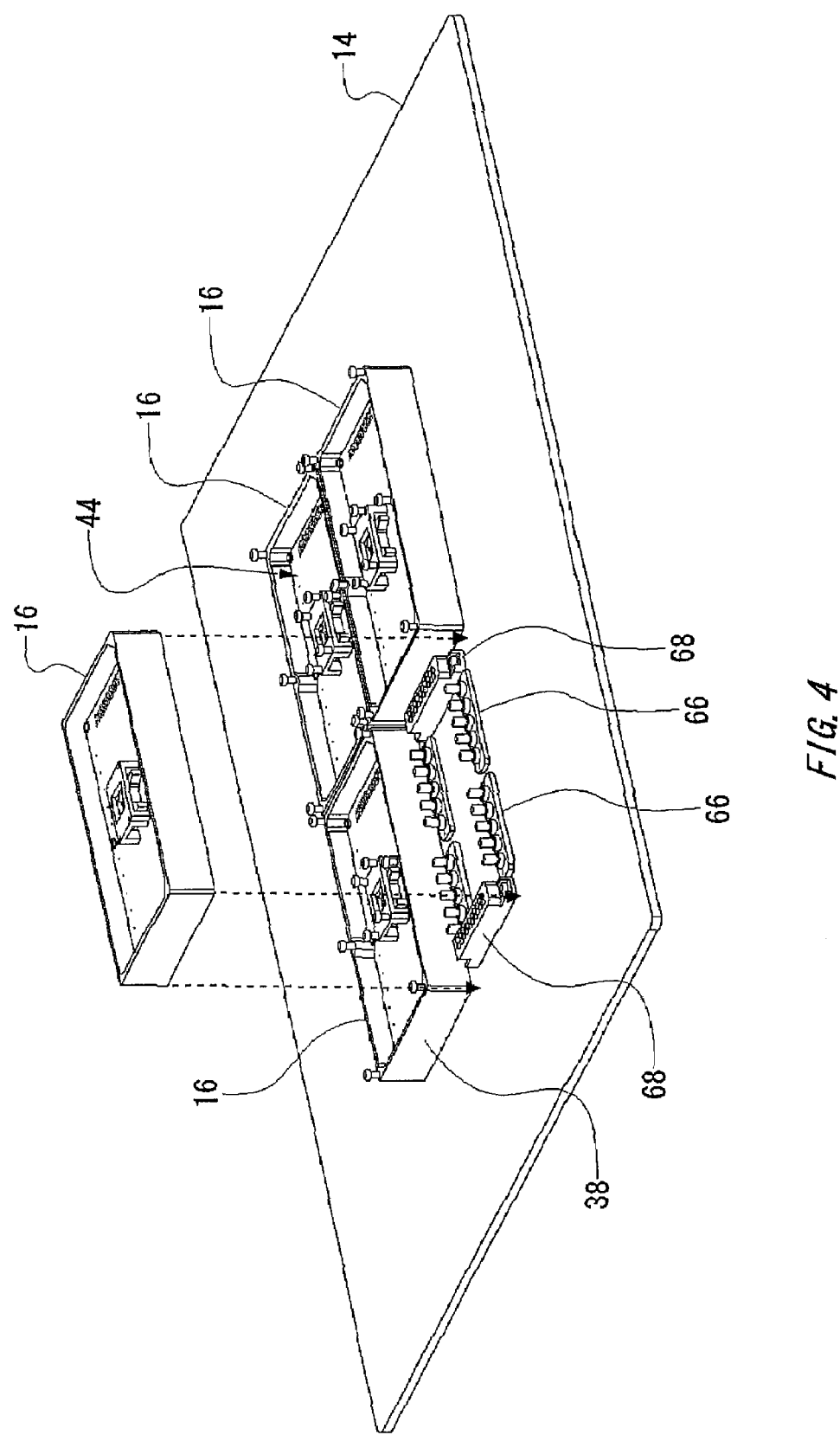
FIG. 4 shows a performance board 14 to which a common top panel 60 is not mounted and a daughter unit 16 is not mounted.
Figure 5:
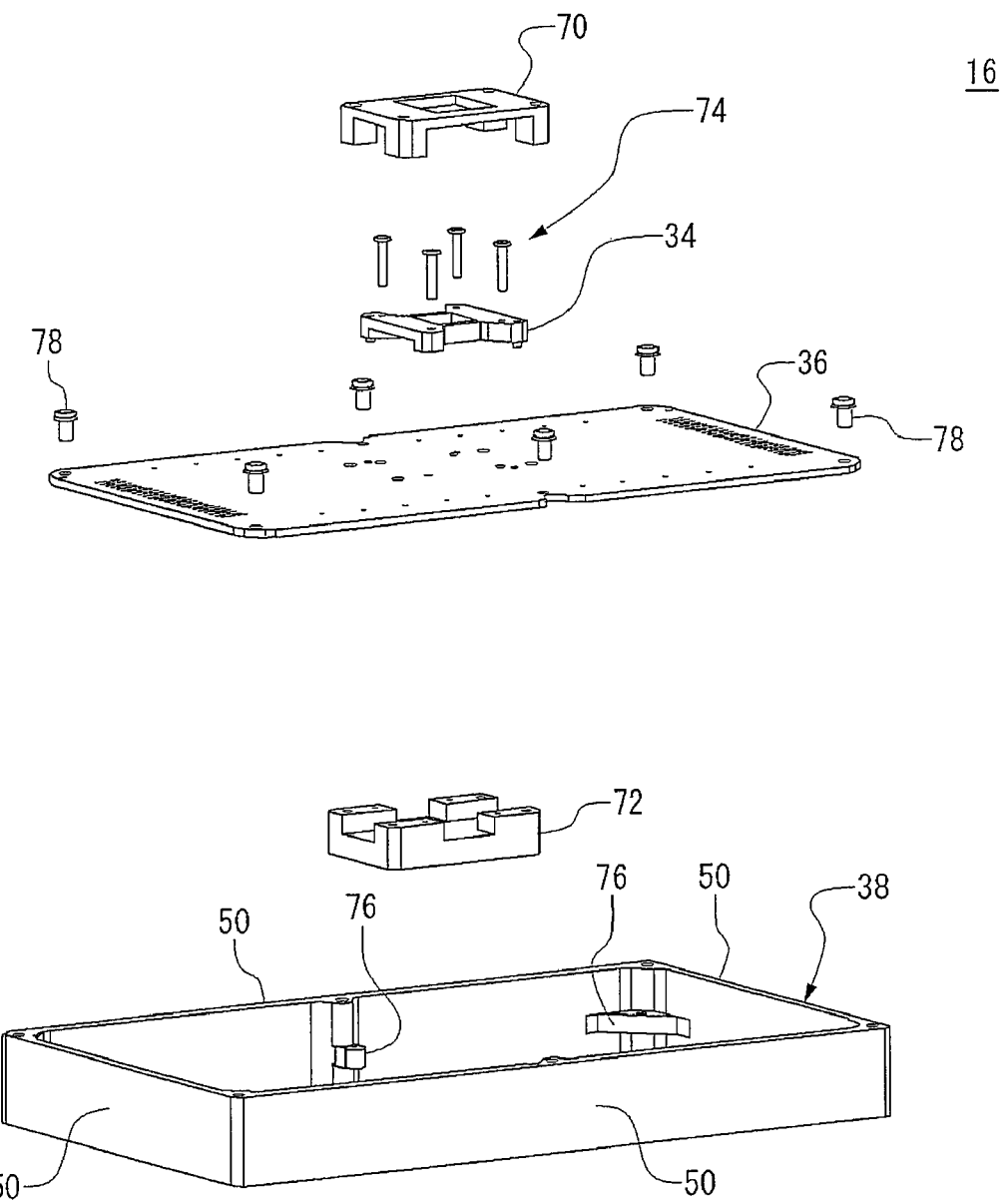
FIG. 5 shows a daughter unit 16 in a dismounted state.

FIGS. 3, 4, and 5 show one example of the configuration of the performance board 14 and the daughter unit 16. FIG. 3 shows a performance board 14 to which a daughter unit 16 and a common top panel 60 are attached. FIG. 4 shows a performance board 14 to which a common top panel 60 is not mounted and one daughter unit 16 is not mounted. FIG. 5 shows a daughter unit 16 in a dismounted state.

As shown in FIGS. 3 and 4, a plurality of number of daughter units 16 having a same form may be mounted to the performance board 14, for example. A plurality of daughter units 16 aligned in a lattice pattern with no space therebetween may be mounted to the performance board 14, for example.

In addition, as shown in FIG. 3, the test system 10 may include a common top panel 60 for collectively shielding the upper openings 44 of the enclosures 38 of the plurality of daughter units 16, as an example of the top panel 40. The common top panel 60 may be a thin plate made of a conductive member such as metal, for example. Such a common top panel 60 is able to cut off electronic noise incident to the inside of the plurality of daughter units 16 via the upper openings 44 from outside.

In addition, the common top panel 60 includes a chuck opening 52 through which the chuck 400 of the handler apparatus moves the device 300 under test to a position corresponding to the socket 34 of each daughter unit 16, to mount the device 300 under test to the socket 34. Accordingly, the chuck 400 of the handler apparatus is able to move a plurality of devices 300 under test to inside respective daughter units 16 through the chuck openings 52, to be mounted to the sockets 34.

In addition, as shown in FIG. 4, the performance board 14 may include an RF pin block 66 and a pogo pin block 68 on the upper surface thereof, as one example of the performance-board connector 26. The RF pin block 66 includes a plurality of RF terminals having the coaxial structure arranged in a straight formation. According to such an RF pin block 66, it is possible to attach a plurality of RF terminals to the performance board 14 in an integrated manner. The RF terminals included in a RF pin block 66 may be terminals of a pogo structure.

The pogo pin block 68 includes a plurality of pogo pins conveying a low-frequency signal. According to such a pogo pin block 68, it is possible to attach a plurality of pogo pins to the performance board 14 in an integrated manner.

For example, the RF pin block 66 and the pogo pin block 68 may be provided in a portion corresponding to the edge of the daughter board 36, in the state where the daughter unit 16 is mounted to the performance board 14. If the daughter board 36 has a main surface in a form of a thin rectangular plate, the RF pin block 66 and the pogo pin block 68 may be provided in the vicinity of the four sides of the rectangle. To be more specific, the RF pin block 66 may be provided so that RF pins align in the vicinity of the two long sides and along the two long sides, for example. In addition, the RF pin block 66 may be provided so that pogo pins align in the vicinity of the two short sides and along the two short sides, for example. Accordingly, each terminal in the RF pin block 66 and the pogo pin block 68 is subjected to a uniform force for example, in the state where the daughter unit 16 is mounted to the performance board 14, thereby connecting each terminal assuredly to the daughter unit 16.

As shown in FIG. 5, the daughter board 36 may have a main surface in a form of a thin rectangular plate, and have a socket 34 in the substantial center of the main surface, for example. The socket 34 is fixed to the daughter board 36 by means of a socket bolt 74.

The enclosure 38 may be formed as a tube whose inner radius has the same form (rectangle) as the form of the main surface of the daughter board 36. In other words, the enclosure 38 may include a plurality of side panels 50 for shielding purpose, which are provided to correspond to sides of the daughter board 36 having a rectangular form, respectively. The plurality of side panels 50 may be made of a conductive material such as metal or the like, for example. The plurality of side panels 50 are provided to be vertical to the daughter board 36, and may be the same as the sides of the daughter board 36 whose long side length corresponds to each other. Furthermore, the plurality of side panels 50 may have the same short side length to each other.

The enclosure 38 includes a support 76 attached to the substantially central position in the short side direction (height direction) inside the side panel 50. The daughter board 36 is fixed to the support 76 by means of a board bolt 78. Accordingly, the enclosure 38 is able to accommodate therein the daughter board 36 within the plurality of side panels 50.

The daughter unit 16 may further have an upper socket guide 70 and a lower socket guide 72. The upper socket guide 70 is provided on the upper surface side of the daughter board 36. The upper socket guide 70 is provided as if to cover the socket 34 from above, and fixes the socket 34. Note that the upper socket guide 70 has an opening in an area corresponding to a position of the socket 34 in which a device 300 under test is to be mounted, so as to mount a device 300 under test to the socket 34 from above.

The lower socket guide 72 is provided in a position on the lower surface side of the daughter board 36 which corresponds to the upper socket guide 70. Such upper socket guide 70 and lower socket guide 72 sandwich the socket 34 from above and below, and are able to support the socket 34 at the time of holding the device 300 under test.

In addition, as shown in FIGS. 3 and 4, the plurality of daughter units 16 may be fixed to the performance board 14 together with the common top panel 60, by means of a plurality of outer bolts 62 and a plurality of inner bolts 64, for example. Each of the plurality of outer bolts 62 fixes both of the common top panel 60 and the enclosure 38 together to the performance board 14. For example, when the enclosure 38 includes a plurality of side panels 50, the plurality of outer bolts 62 may fix, by screws, both of the common top panel 60 and the enclosure 38 together to the performance board 14 in the vicinity of the four corners of the enclosure 38.

Each of the plurality of inner bolts 64 fixes all of the common top panel 60, the upper socket guide 70, and the lower socket guide 72 together to the performance board 14. For example, the plurality of inner bolts 64 may fix the upper socket guide 70 and the lower socket guide 72 to the performance board 14 by screws, in a position nearer to the socket 34 than the fixing position by means of the outer bolts 62 (e.g. in the vicinity of the socket 34).

According to such a test system 10, it is possible to simultaneously test a plurality of devices 300 under test. Furthermore, according to such a test system 10, it is possible to cut off electromagnetic noise for each of the devices 300 under test, and so it is possible to cut off electromagnetic noise conveyed between the devices 300 under test.

Furthermore, when simultaneously testing a plurality of devices 300 under test that are same as each other, there is a case where the measurement results differ according to the positions of the devices 300 under test on the performance board 14. In such a case, according to the test system 10, it is possible to remove the daughter unit 16 which is suspected to have the cause of the error for individual adjustment and mending, or to exchange the daughter unit 16 for a normal one independently. Accordingly, according to the test system 10, it becomes possible to normalize the system without adjusting or mending the entire performance board 14.

In addition, when simultaneously testing the plurality of devices 300 under test by mounting them to the plurality of daughter units 16, the test system 10 may conduct calibration prior to the test, for measuring the variation of the characteristics among the plurality of the daughter units 16. Then the test module 20 may amend a plurality of output signals from the devices 300 under test received via the daughter units 16 and the performance board 14, according to the variation of the characteristics among the daughter units 16 measured at the time of calibration. The test module 20 may, for example, adjust a gain of a plurality of output signals, the frequency characteristics of the plurality of output signals, and so on.

Figure 6:
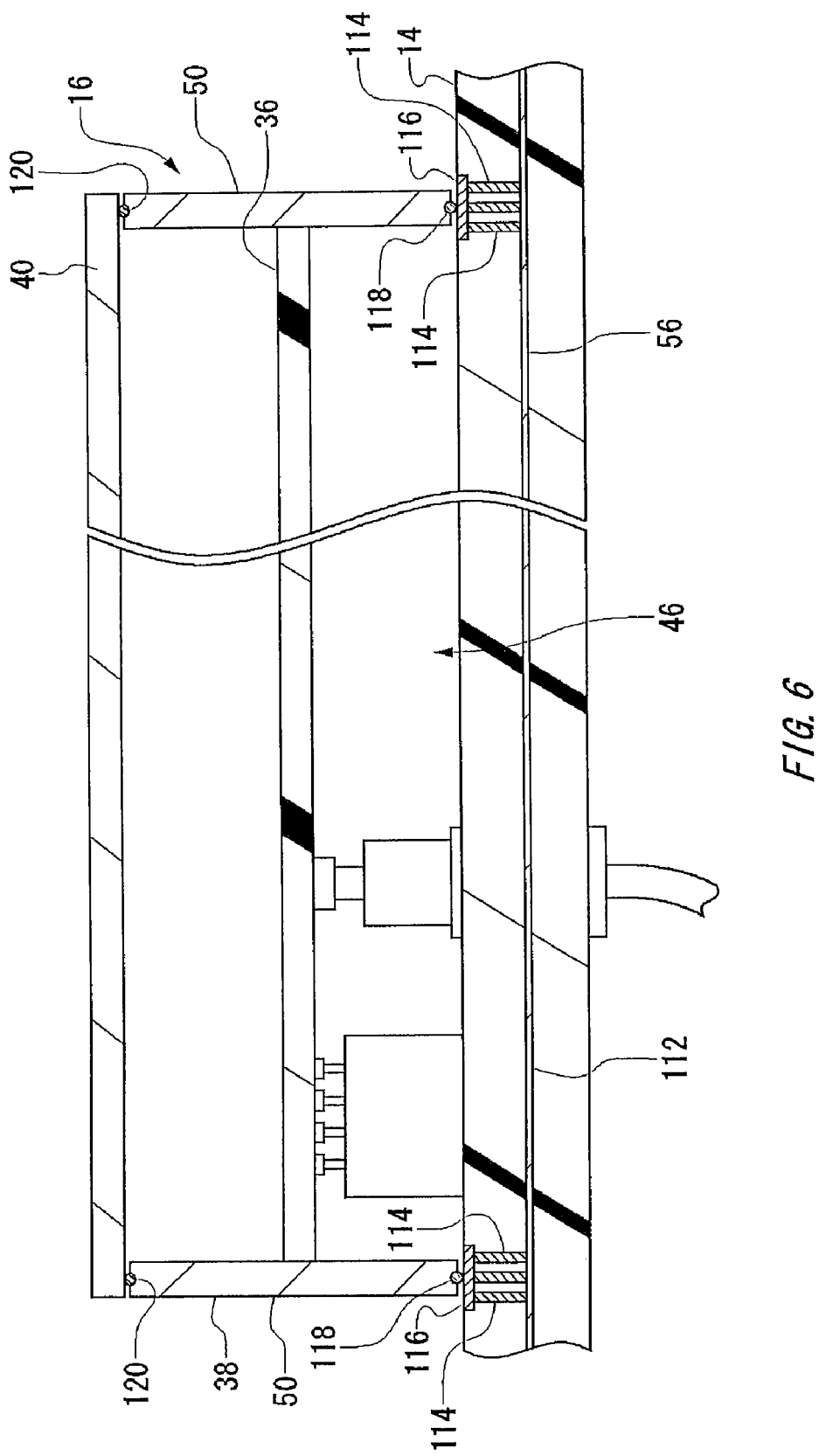
FIG. 6 shows one example of a cross section of a performance board 14 and a daughter unit 16.
Figure 7:
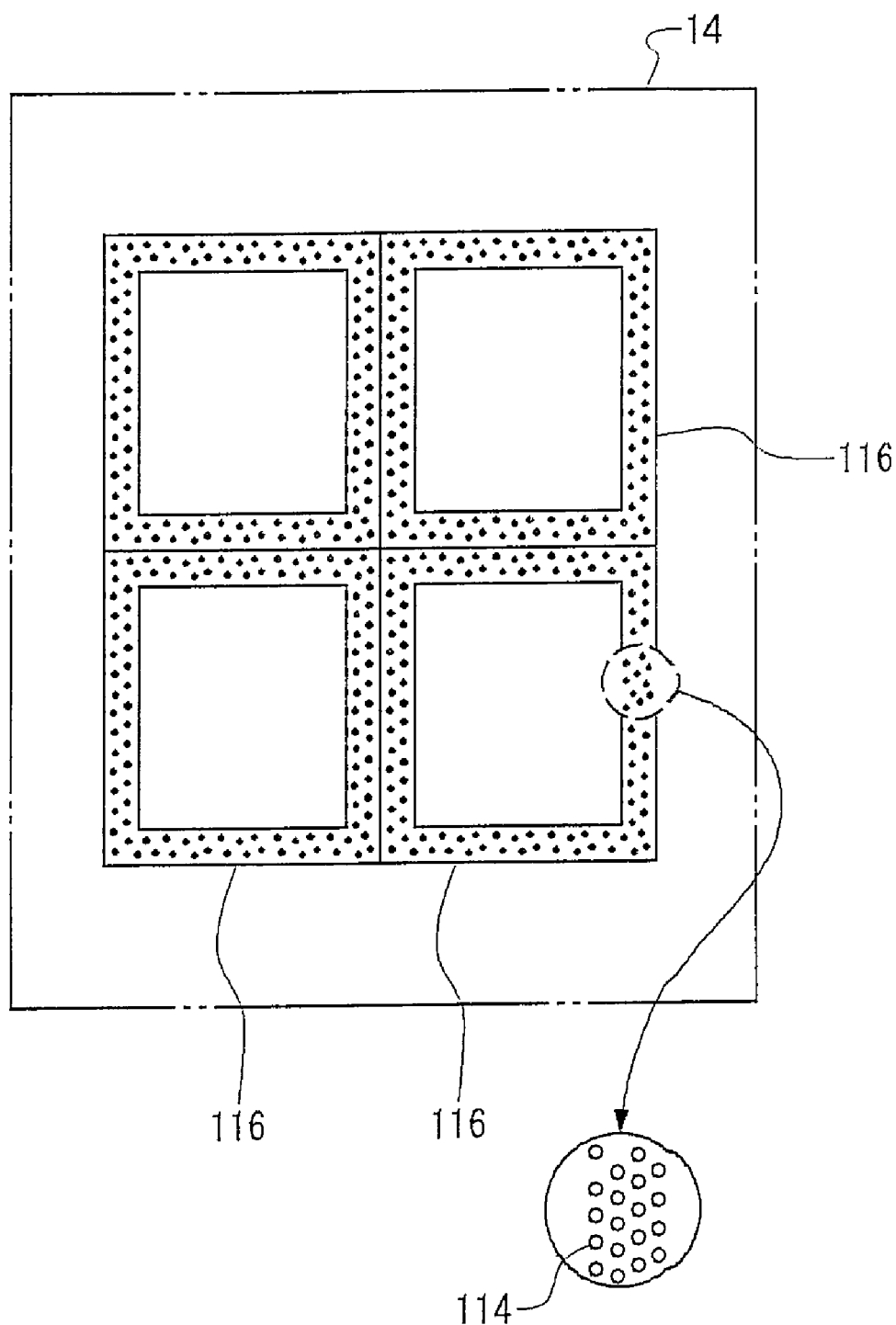
FIG. 7 shows one example of an upper surface of a performance board 14 to which a daughter unit 16 is not mounted.

FIG. 6 shows one example of a cross section of the performance board 14 and the daughter unit 16. FIG. 7 shows one example of the upper surface of the performance board 14 to which the daughter unit 16 is not mounted.

The performance-board shield 56 includes, for example, a shield pattern 112, a plurality of conductive through holes 114, and a surface conductive pattern 116. The shield pattern 112 is provided in a layer lower than the upper surface of the performance board 14. The shield pattern 112 shields an area corresponding to the lower opening 46 in the state where the daughter unit 16 is mounted to the performance board 14. For example, the shield pattern 112 may be a layer formed of a conductive material.

A plurality of conductive through holes 114 are provided inside the performance board 14, and elongate to the upper surface of the performance board 14 from the shield pattern 112, to be connected to the enclosure 38. For example, the plurality of conductive through holes 114 may be aligned in substantially constant intervals so as to surround the area corresponding to the lower opening 46 in the state where the daughter unit 16 is mounted to the performance board 14. Accordingly, the plurality of conductive through holes 114 are able to cut off the electromagnetic noise incident to the inside of the daughter unit 16 from the space formed therebetween.

The performance board 14 may for example include a plurality of conductive through holes 114 provided at a predetermined density in each area of the plurality of side panels 50 included in the enclosure 38. In this case, each of the plurality of conductive through holes 114 may connect a corresponding side panel 50 and the shield pattern 112, for example. Accordingly, for example, the plurality of conductive through holes 114 are able to surround the area corresponding to the lower opening 46.

In addition, each of the plurality of conductive through holes 114 may be provided to have a predetermined interval or below with an adjacent conductive through hole 114. Each of the plurality of conductive through holes 114 may be provided so that the interval with an adjacent conductive through hole 114 is ½ or below of the minimum wavelength of the electromagnetic wave incident as electromagnetic noise. Accordingly, the plurality of conductive through holes 114 are able to assuredly cut off the electromagnetic noise. In addition, as an example, the plurality of conductive through holes 114 may be provided in a houndstooth check pattern as shown in the enlarged portion X in FIG. 7.

The surface conductive pattern 116 is provided on the upper surface of the performance board 14, and electrically connects the plurality of conductive through holes 114 with each other. Further, the surface conductive pattern 116 may be provided in an area of the upper surface of the performance board 14 where the enclosure 38 (e.g. a plurality of side panels 50) is in contact, in the state where the daughter unit 16 is mounted to the performance board 14.

Such a performance-board shield 56 is able to shield the lower opening 46 of the enclosure 38, in the state where the daughter unit 16 is mounted to the performance board 14. In other words, the performance-board shield 56 is able to cut off the electromagnetic noise incident to the inside of the daughter unit 16 via the lower opening 46 from outside.

In addition, the side panel 50 included in the enclosure 38 may include a performance-board gasket 118 at a portion contacting the performance-board shield 56. The performance-board gasket 118 may be conductive and hollow inside. Such a performance-board gasket 118 is able to connect the side panel 50 and the performance-board shield 56 without any space therebetween. Accordingly, the performance-board gasket 118 is able to cut off the electromagnetic noise incident to the inside of the daughter unit 16 from a space formed between the side panel 50 and the performance-board shield 56.

In addition, the side panel 50 included in the enclosure 38 may include a top-panel gasket 120 at a portion contacting the top panel 40. The top-panel gasket 120 may be hollow and conductive. Such a top-panel gasket 120 is able to connect the side panel 50 and the top panel 40 without any space therebetween. Accordingly, the top-panel gasket 120 is able to cut off electromagnetic noise incident to the inside of the daughter unit 16 from a space formed between the side panel 50 and the top panel 40.

Figure 8:
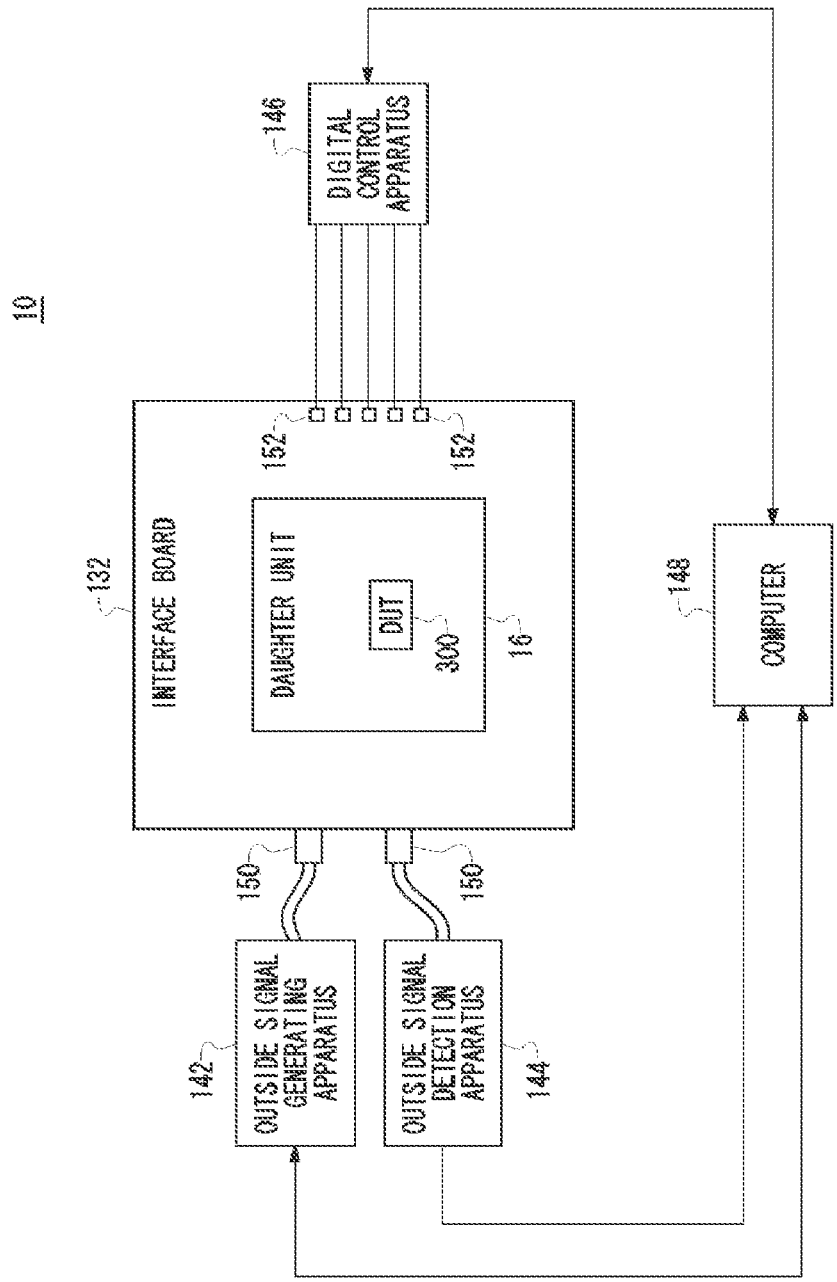
FIG. 8 shows a construction of a test system 10 according to a first modification example regarding the present embodiment.
Figure 9:
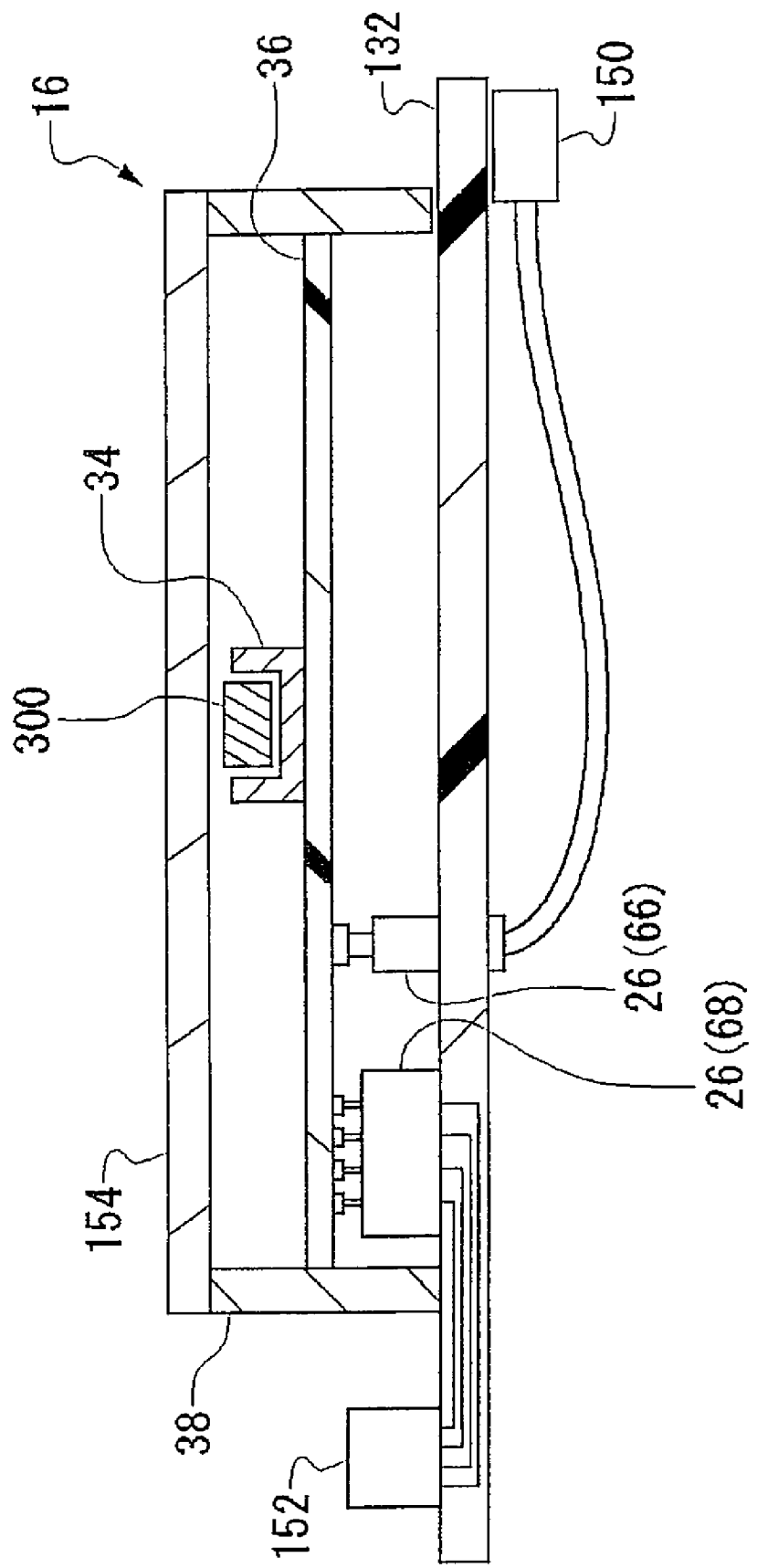
FIG. 9 shows cross sections of an interface board 132 and a daughter unit 16 according to a first modification example, together with a device 300 under test.

FIG. 8 shows a construction of a test system 10 according to a first modification example regarding the present embodiment. FIG. 9 shows cross sections of an interface board 132 and a daughter unit 16 according to the first modification example, together with a device 300 under test. Note that the present modification example adopts substantially the same configuration and function as those of the members of the present embodiment. In view of this, the members in the explanation of FIG. 8 and FIG. 9 whose configuration and function are the same as those of the members included in the test system 10 according to the present embodiment are assigned the same reference numerals, and are not detailed in the following except for the differences.

The test system 10 according to the present modification example measures the characteristics of a device 300 under test using an individual measurement device, instead of the test head 12. The test system 10 according to the present modification example may be installed in an experimental laboratory different from mass production factories, for example.

The test system 10 according to the present modification example includes an outside signal generating apparatus 142, an outside signal detection apparatus 144, a digital control apparatus 146, a computer 148, an interface board 132, and a daughter unit 16. The outside signal generating apparatus 142 is one example of the measurement device for measuring the characteristics of a device 300 under test, and generates a test signal having an analogue waveform to be given to the device 300 under test. The outside signal detection apparatus 144 is one example of the measurement device for measuring the characteristics of a device 300 under test, and digitalizes an analogue output signal outputted from the device 300 under test.

The digital control apparatus 146 is one example of the measurement device for measuring the characteristics of a device 300 under test, and generates a digital control signal and a power supply voltage to be given to the device 300 under test. The computer 148 controls the outside signal generating apparatus 142, the outside signal detection apparatus 144, and the digital control apparatus 146, and analyzes the characteristics of the device 300 under test based on the measurement result obtained from the outside signal generating apparatus 142, the outside signal detection apparatus 144, and the digital control apparatus 146.

The interface board 132 conveys a signal generated by the outside signal generating apparatus 142 and the digital control apparatus 146, to the daughter unit 16. Furthermore, the interface board 132 conveys an output signal outputted from the device 300 under test, from the daughter unit 16 to the outside signal detection apparatus 144.

In addition, the interface board 132 includes at least one performance-board connector 26 on the upper surface thereof. The performance-board connector 26 is connected to the daughter-board connector 42 provided for the daughter unit 16, thereby supplying a test signal and a control signal to the daughter unit 16. In addition, the performance-board connector 26 is connected to the daughter-board connector 42 provided for the daughter unit 16, thereby receiving an output signal from the daughter unit 16. The interface board 132 may include an RF pin block 66 and a pogo pin block 68, as one example of the performance-board connector 26.

In addition, the interface board 132 may include an RF terminal 150 and a digital terminal 152. The RF terminal 150 connects, via a cable, the outside signal generating apparatus 142 and the outside signal detection apparatus 144 with a corresponding performance-board connector 26 (e.g. RF pin block 66). The digital terminal 152 connects, via a cable, the digital control apparatus 146 with a corresponding performance-board connector 26 (e.g. performance-board connector 26).

A device 300 under test is mounted to the daughter unit 16. Furthermore, the daughter unit 16 is mounted detachably onto the interface board 132. The daughter unit 16 is also mounted to the performance board 14 of the test system 10 as shown in FIGS. 1 and 2. In other words, the daughter unit 16 is mounted common to the performance board 14 and the interface board 132. Accordingly, a user is able to remove the daughter unit 16 from the performance board 14 of the test system 10 installed in a mass production factory, and mount it to the interface board 132 installed in an experimental laboratory for example.

The test system 10 according to the present modification example may further include an individual top panel 154. The individual top panel 154 shields the upper opening 44 of the enclosure 38 individually in the state in which the daughter unit 16 is mounted on the interface board 132. In other words, the individual top panel 154 may be a thin plate having substantially the same size as the size of the upper opening 44 of one daughter unit 16, different from the common top panel 60 shown in FIG. 3.

In addition, the individual top panel 154 may not include a chuck opening 52, unlike the common top panel 60 shown in FIG. 3. The individual top panel 154 may be for example a conductive member such as metal. Such an individual top panel 154 is able to cut off electromagnetic noise incident to the inside of the daughter unit 16 via the upper opening 44 from outside.

Here, the interface board 132 may not be mounted to the test head 12 of the test system 10 installed in a mass production factory. In view of this, the interface board 132 may be compact and light compared to the performance board 14 for example. Accordingly, the test system 10 according to the present modification example is able to be installed in an experimental laboratory, unlike the test system 10 employed in mass production in a semiconductor production factory or the like.

In addition, according to the test system 10 according to the present modification example, it is possible to mount a daughter unit 16 removed from the performance board 14 of the test system 10 installed in a mass production factory, to an interface board 132. Therefore, according to the test system 10 according to the present modification example, it is possible to easily compare the measurement result of the characteristics of a device 300 under test in a mass production environment with the measurement result of the characteristics of a device 300 under test in an environment where highly accurate test can be pursued (e.g. experimental laboratory).

Further, the test system 10 according to the present modification example is able to help reduce the size of the interface board 132. Accordingly, it becomes possible to measure the characteristics of a device 300 under test by storing the entire interface board 132 in a dark box, for example. As a result, according to the test system 10 according to the present modification example, it is possible to accurately measure a parameter (e.g. noise factor (NF) and so on) whose measurement result largely fluctuates according to the electromagnetic noise.

Figure 10:
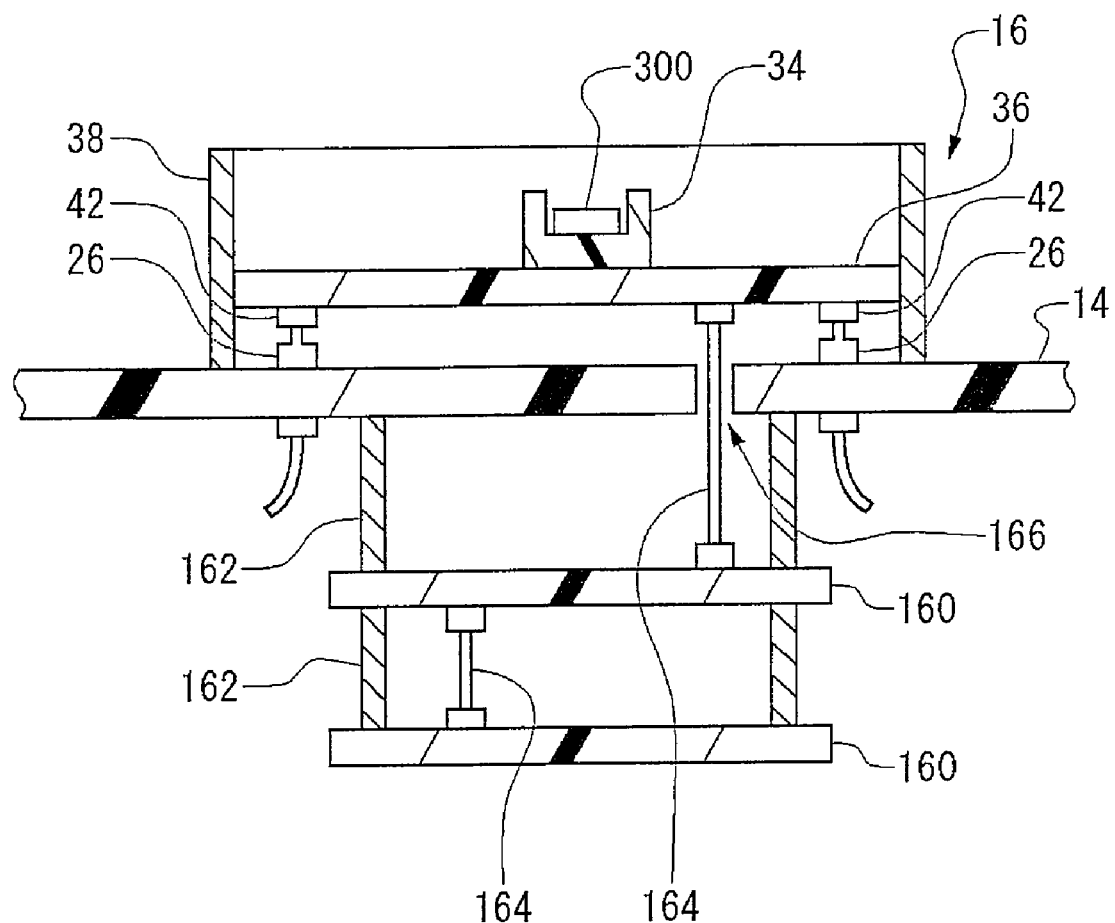
FIG. 10 shows cross sections of a performance board 14 and a daughter unit 16 according to a second modification example regarding the present embodiment.

FIG. 10 shows cross sections of a performance board 14 and a daughter unit 16 according to a second modification example regarding the present embodiment. Note that the present modification example adopts substantially the same configuration and function as those of the present embodiment. In view of this, the members in the explanation of FIG. 10 whose configuration and function are the same as those of the members included in the test system 10 according to the present embodiment are assigned the same reference numerals, and are not detailed in the following except for the differences.

A daughter unit 16 according to the present modification example further includes at least one extension board 160 fixed to the lower side of the daughter board 36 so as to be parallel to the daughter board 36. The extension board 160 is placed lower than the lower surface of the performance board 14, in the state where the daughter unit 16 is mounted to the performance board 14. In other words, the extension board 160 is placed in the direction of a surface of the performance board 14 that is opposite to the daughter board 36 (lower surface side of the performance board 14), in the state where the daughter unit 16 is mounted to the performance board 14.

In addition, the daughter unit 16 may include a fix portion 162 for fixing the extension board 160 at the lower surface side of the performance board 14. Furthermore, the daughter unit 16 further includes wiring 164 connecting between the daughter board 36 and the extension board 160 (or the plurality of extension boards 160).

Here, in the present modification example, the performance board 14 includes a hole 166 penetrating from the upper surface to the lower surface, in a position corresponding to the extension board 160. The wiring 164 connecting between the daughter board 36 and the extension board 160 is placed from the upper surface side to the lower surface side of the performance board 14, via the hole 166. According to this arrangement, the hole 166 is able to position the lower surface of the extension board 160 lower than the upper surface of the performance board 14, in the state where the daughter unit 16 is mounted. According to the daughter unit 16 according to the present modification example, it is possible to extend the circuitry, function, or the like that the daughter board 36 should include, to the lower side of the performance board 14.

Figure 11:
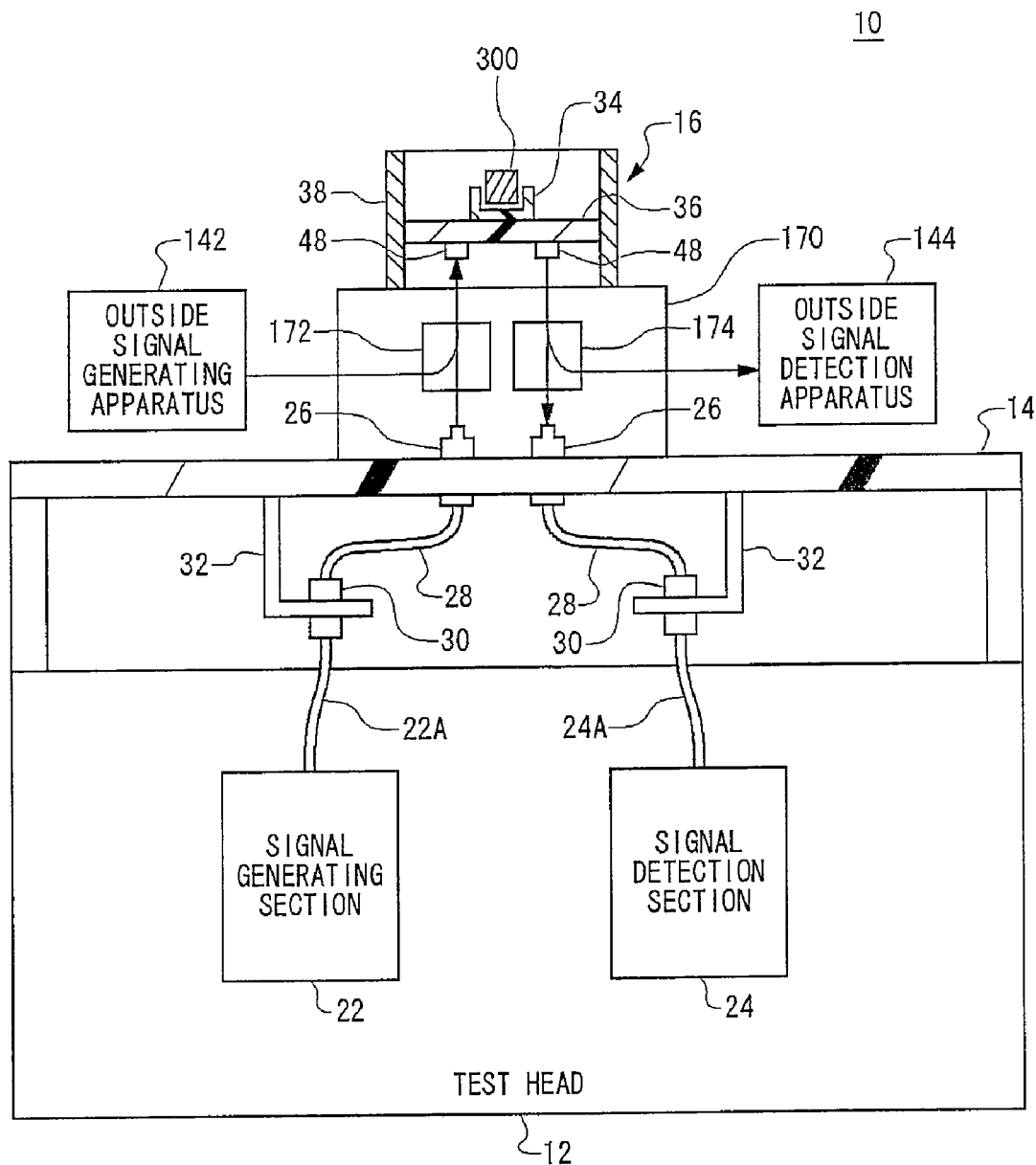
FIG. 11 shows a test system 10 according to a third modification example regarding the present embodiment.

FIG. 11 shows a test system 10 according to a third modification example regarding the present embodiment. Note that the present modification example adopts substantially the same configuration and function as those of the present embodiment. In view of this, the members in the explanation of FIG. 11 whose configuration and function are the same as those of the members included in the test system 10 according to the present embodiment are assigned the same reference numerals, and are not detailed in the following except for the differences.

The test system 10 according to the present modification example further includes an outside signal generating apparatus 142, an outside signal detection apparatus 144, and an addition unit 170. The outside signal generating apparatus 142 is one example of the measurement device for measuring the characteristics of a device 300 under test, and generates a test signal to be given to the device 300 under test. The outside signal generating apparatus 142 is provided outside the test head 12.

The outside signal detection apparatus 144 is one example of the measurement device for measuring the characteristics of a device 300 under test, and detects an output signal outputted from the device 300 under test. The outside signal detection apparatus 144 is provided outside the test head 12.

The addition unit 170 is mounted as an addition between the performance board 14 and the daughter unit 16, at the time of calibration conducted prior to the test of a device 300 under test. The addition unit 170 receives a first test signal generated by the signal generating section 22 and a second test signal generated by the outside signal generating apparatus 142, and supplies a test signal based on at least one of the first test signal and the second test signal, to the daughter unit 16. In addition, the addition unit 170 receives an output signal outputted from a device 300 under test, and supplies a first output signal based on the received output signal, to the signal detection section 24. In addition, the addition unit 170 receives an output signal outputted from a device 300 under test, and supplies a second output signal based on the received output signal, to the outside signal detection apparatus 144.

The addition unit 170 may for example include an input signal coupler 172 and an output signal coupler 174. The input signal coupler 172 supplies a test signal resulting from combining the first test signal generated by the signal generating section 22 and the second test signal generated by the outside signal generating apparatus 142, to the daughter unit 16. The output signal coupler 174 separates the output signal outputted from the device 300 under test, into a first output signal and a second output signal. Then the output signal coupler 174 supplies the first output signal to the signal detection section 24. In addition, the output signal coupler 174 supplies the second output signal to the outside signal detection apparatus 144. The addition unit 170 may include a switch instead of the input signal coupler 172 and the output signal coupler 174.

Such an addition unit 170, at the time of calibration conducted prior to the test of a device 300 under test, supplies a test signal based on the first test signal generated by the signal generating section 22, to the daughter unit 16. Then the addition unit 170 supplies a first output signal based on the output signal outputted from the device 300 under test, to the signal detection section 24.

Following this, the addition unit 170 supplies a test signal based on the second test signal generated by the outside signal generating apparatus 142, to the daughter unit 16. Then the addition unit 170 supplies a second output signal based on the output signal outputted from the device 300 under test, to the outside signal detection apparatus 144.

Next, the test system 10 compares the measurement result of the signal detection section 24 and the measurement result of the outside signal detection apparatus 144. Then the test system 10 calculates errors that the signal generating section 22 and the signal detection section 24 have, according to the comparison result. According to the test system 10 regarding the present modification example, it is possible to measure an error of the test module(s) (e.g. the signal generating section 22 and the signal detection section 24) included in the test head 12. Note that in the third modification example, a device 300 under test mounted to the socket 34 of the daughter unit 16 may be a reference device whose characteristics are predetermined.

Figure 12:
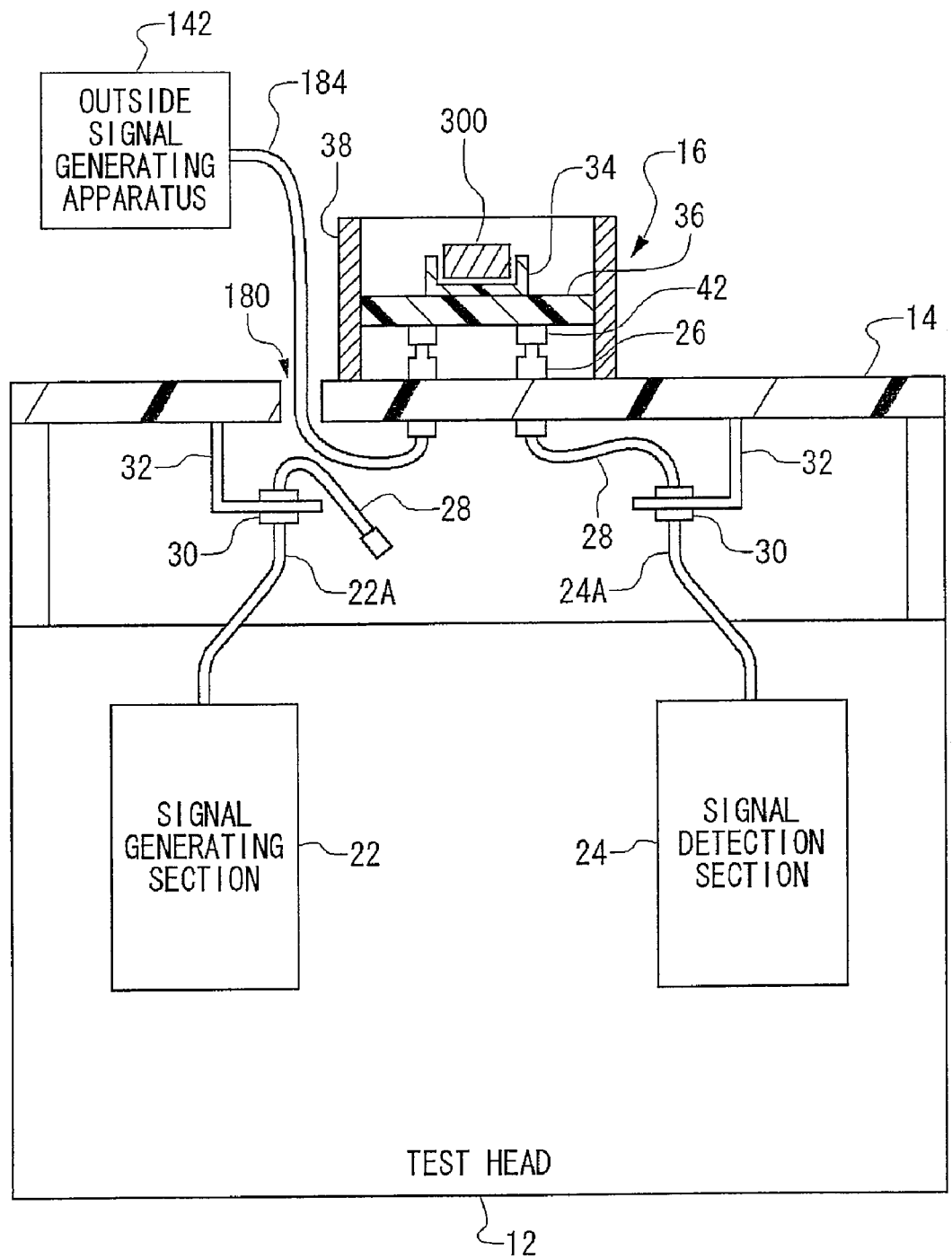
FIG. 12 shows a test system 10 according to a fourth modification example regarding the present embodiment.

FIG. 12 shows a test system 10 according to a fourth modification example regarding the present embodiment. Note that the present modification example adopts substantially the same configuration and function as those of the present embodiment. In view of this, the members in the explanation of FIG. 12 whose configuration and function are the same as those of the members included in the test system 10 according to the present embodiment are assigned the same reference numerals, and are not detailed in the following except for the differences.

The test system 10 according to the present modification example further includes an outside signal generating apparatus 142 and an outside signal generating apparatus RF cable 184. The outside signal generating apparatus 142 is one example of the measurement device for measuring the characteristics of a device 300 under test, and generates a test signal to be given to the device 300 under test. The outside signal generating apparatus 142 is provided outside the test head 12. The outside signal generating apparatus RF cable 184 connects the outside signal generating apparatus 142 to the daughter unit 16 via the performance-board connector 26, instead of the test module(s) 20 (e.g. the signal generating section 22).

In addition, in the present modification example, the performance board 14 includes a cable opening 180 penetrating from the upper surface to the lower surface, in a portion excluding an area to which a daughter unit 16 is mounted. The cable opening 180 passes the outside signal generating apparatus RF cable 184 from the upper surface side to the lower surface side of the performance board 14.

The test system 10 according to the present modification example gives a test signal generated from the outside signal generating apparatus 142 to the device 300 under test, and causes the signal detection section 24 to measure an output signal of the device 300 under test. Accordingly, according to the test system 10 according to the present modification example, it is possible to compare the measurement result in a case where the test signal generated from the signal generating section 22 is given to the device 300 under test with the measurement result in a case where the test signal generated from the outside signal generating apparatus 142 is given to the device 300 under test, thereby calculating an error that the signal generating section 22 has.

Note that in the fourth modification example, a device 300 under test mounted to the socket 34 of the daughter unit 16 may be a reference device whose characteristics are predetermined. In addition, in the present modification example, when conducting a test in state where a chamber is mounted above the performance board 14 and sets the device 300 under test to have a predetermined temperature, it is preferable that the test system 10 further includes a plug for sealing the cable opening 180. By this arrangement, the test system 10 is able to maintain the temperature within the chamber at a predetermined temperature.

Figure 13:
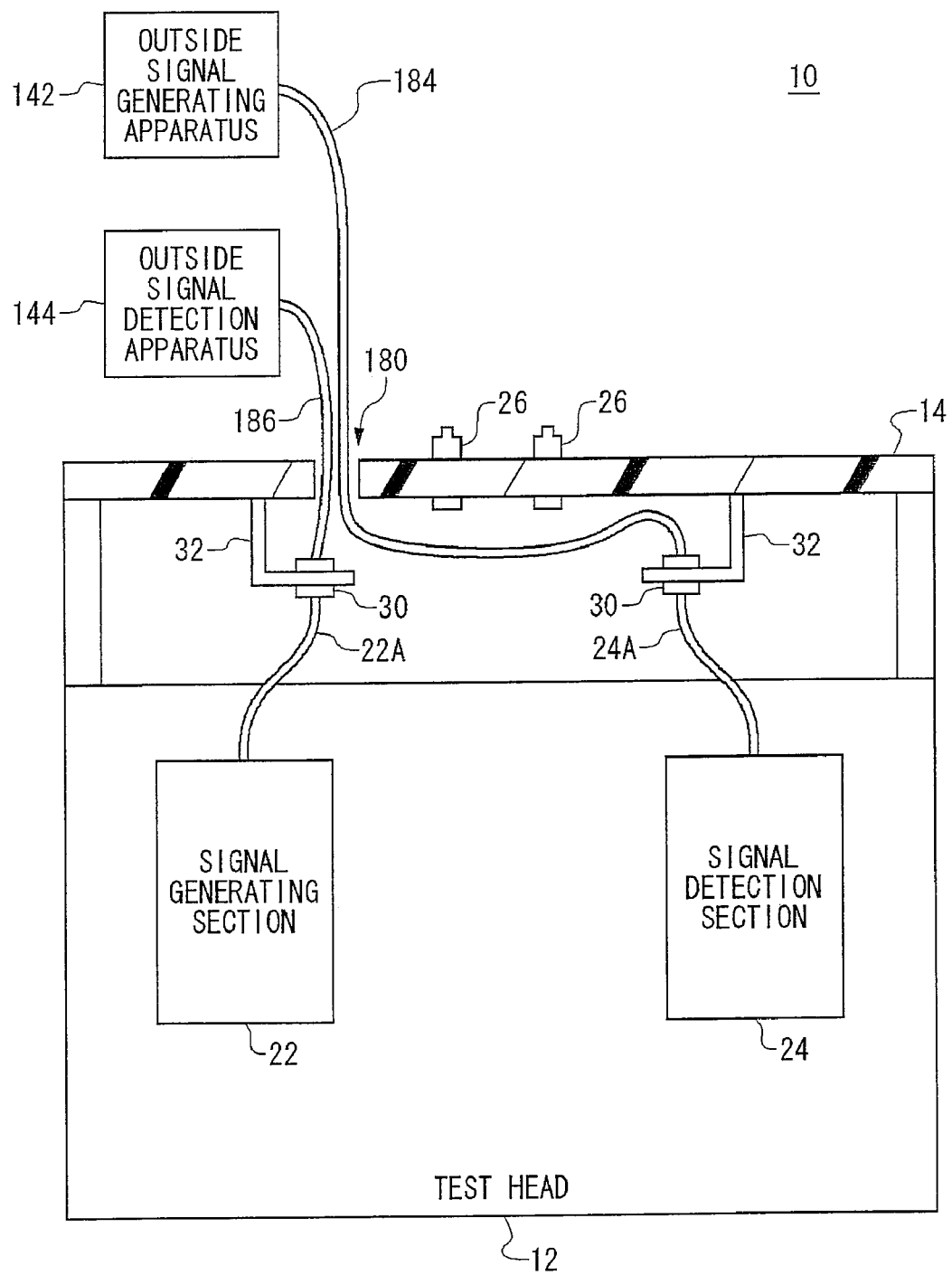
FIG. 13 shows a test system 10 according to a fifth modification example regarding the present embodiment.

FIG. 13 shows a test system 10 according to a fifth modification example regarding the present embodiment. Note that the present modification example adopts substantially the same configuration and function as those of the present embodiment. In view of this, the members in the explanation of FIG. 13 whose configuration and function are the same as those of the members included in the test system 10 according to the present embodiment are assigned the same reference numerals, and are not detailed in the following except for the differences.

The test system 10 according to the present modification example further includes an outside signal generating apparatus 142, an outside signal detection apparatus 144, an outside signal generating apparatus RF cable 184, and an outside signal detection apparatus RF cable 186. The outside signal generating apparatus 142 generates an arbitrary signal having an analogue waveform. The outside signal generating apparatus 142 is provided outside the test head 12. The outside signal detection apparatus 144 digitalizes an analogue signal.

The outside signal generating apparatus RF cable 184 connects the outside signal generating apparatus 142 with the signal detection section 24. The outside signal detection apparatus RF cable 186 connects the outside signal detection apparatus 144 with the signal generating section 22. In addition, in the present modification example, the performance board 14 includes a cable opening 180 penetrating from the upper surface to the lower surface. The cable opening 180 penetrates the outside signal generating apparatus RF cable 184 and the outside signal detection apparatus RF cable 186, from the upper surface side to the lower surface side of the performance board 14.

The test system 10 according to the present modification example causes the signal detection section 24 to measure an arbitrary analogue signal generated from the outside signal generating apparatus 142, at the time of calibration conducted prior to the test of a device 300 under test. As a result, the test system 10 regarding the present modification example is able to calibrate the signal detection section 24. In addition, the test system 10 according to the present modification example causes the outside signal detection apparatus 144 to measure an arbitrary analogue signal generated from the signal generating section 22 at the time of calibration conducted prior to the test of a device 300 under test. As a result, according to the test system 10 regarding the present modification example, it is possible to calibrate the signal generating section 22.

In the above, some aspects of the present invention have been described by way of exemplary embodiments. However, it is needless to say that the technical scope of the present invention should not be limited by the above-described embodiments. It should be understood that those skilled in the art might make various types of modifications and substitutions to the above-described embodiments without departing from the spirit and the scope of the present invention. It is obvious from the appended claims that embodiments with such modifications or substitutions also belong to the technical scope of the present invention.

What is claimed is:

1. A test system that tests a device under test, the test system comprising:
a test head that includes a test module that generates a test signal to be supplied to the device under test;
a performance board that is mounted above the test head and conveys the test signal generated by the test module; and
a daughter unit that is detachably mounted to the performance board, and conveys the test signal from the performance board to the device under test,
wherein the daughter unit includes:
a socket to which the device under test is mounted;
a daughter board to which the socket is mounted; and
an enclosure that accommodates therein the socket and the daughter board, and includes a daughter-unit shield that cuts off noise from outside with respect to the socket and the daughter board.

2. The test system as set forth in claim 1, wherein
the performance board includes, on an upper surface thereof, a performance-board connector that supplies the test signal to the daughter unit, and
the daughter board includes a daughter-board connector at a lower surface of the daughter board, the daughter-board connector, by being connected to the performance-board connector, receiving the test signal supplied from the performance-board connector, and the daughter board connects the daughter-board connector and the socket.

3. The test system as set forth in claim 2, wherein
the enclosure has a lower opening in the direction of the performance board, and
the performance-board connector is provided in a position corresponding to the lower opening, in a state where the daughter unit is mounted to the performance board, and elongates from an upper surface of the performance board towards the daughter board, to be connected to the daughter-board connector.

4. The test system as set forth in claim 3, wherein
the performance board includes a performance-board shield that shields the lower opening, in a state that the daughter unit is mounted to the performance board.

5. The test system as set forth in claim 4, wherein
the performance-board shield includes:
a shield pattern that is provided in a layer lower than the upper surface of the performance board, and shields an area corresponding to the lower opening, in a state where the daughter unit is mounted to the performance board; and
a conductive through hole that elongates to the upper surface of the performance board from the shield pattern, and is connected to the enclosure.

6. The test system as set forth in claim 5, wherein
the enclosure includes a plurality of side panels for shielding purpose that are provided to correspond to sides of the daughter board respectively, and
the performance-board shield includes a plurality of conductive through holes that are provided to correspond to the plurality of side panels respectively and connect to the corresponding side panels.

7. The test system as set forth in claim 6, wherein
the performance-board shield includes a pattern that connects the plurality of conductive through holes that correspond to the plurality of side panels respectively, in the upper surface of the performance board.

8. The test system as set forth in claim 2, wherein
the enclosure includes an upper opening in an upper direction,
a plurality of daughter units are mounted to the performance board, and
the test system further comprises a common top panel that collectively shields upper openings of enclosures of the plurality of daughter units.

9. The test system as set forth in claim 8, wherein
the common top panel includes a chuck opening through which a chuck of a handler apparatus moves the device under test to a position corresponding to the socket of one of the plurality of daughter units, to mount the device under test to the socket.

10. The test system as set forth in claim 9, wherein
the plurality of daughter units are fixed to the performance board together with the common top panel by means of a bolt.

11. The test system as set forth in claim 10, wherein
each of the plurality of daughter units is fixed to the performance board by means of a bolt in the vicinity of four corners of the daughter unit and a bolt in the vicinity of the socket.

12. The test system as set forth in claim 9, wherein
the daughter unit is detachably mountable to an interface board that is not mountable above the test head, the interface board being connected to a measurement device that measures characteristics of the device under test, and
the test system further comprises an individual top panel that individually shields an upper opening of the enclosure in a state where the daughter unit is mounted to the interface board.

13. The test system as set forth in claim 12, wherein
the individual top panel covers the upper opening including over the socket.

14. The test system as set forth in claim 2, wherein
the daughter unit further includes an extension board fixed in a lower side of the daughter board so as to be parallel to the daughter board, and
the performance board has a hole in a position corresponding to the extension board so as to position a lower surface of the extension board below the upper surface of the performance board, in a state where the daughter unit is mounted to the performance board.

15. The test system as set forth in claim 2, further comprising:
an addition unit that is additionally mountable between the performance board and the daughter unit, receives a first test signal generated by the test module and a second test signal generated by an outside measurement device, and supplies a test signal based on at least one of the first test signal and the second test signal to the daughter unit.

16. The test system as set forth in claim 2, wherein
the performance board includes, in a portion excluding an area to which the daughter unit is mounted, a cable opening that passes a cable from an upper surface side to a lower surface side of the performance board, the cable connecting an outside measurement device instead of the test module, to the daughter unit via the performance-board connector.

17. The test system as set forth in claim 2, wherein
a plurality of daughter units are mounted to the performance board,
the test module receives an output signal from the device under test, via one of the daughter units and the performance board, and
the test system amends a variation of characteristics among the daughter units, based on an output signal from the device under test in a case where the same device under test is mounted to each of the plurality of daughter units.

18. A daughter unit detachably mounted to a performance board included in a test system, the test system including a test head that includes a test module that generates a test signal to be supplied to a device under test and the performance board that is mounted above the test head and conveys the test signal generated by the test module, the daughter unit conveying the test signal from the performance board to the device under test, the daughter unit comprising:

a socket to which the device under test is mounted;
a daughter board to which the socket is mounted; and
an enclosure that accommodates therein the socket and the daughter board, and includes a daughter-unit shield that cuts off noise from outside with respect to the socket and the daughter board.

19. The daughter unit as set forth in claim 18, wherein
the performance board includes, on an upper surface thereof, a performance-board connector that supplies the test signal to the daughter unit, and
the daughter board includes a daughter-board connector at a lower surface of the daughter board, the daughter-board connector, by being connected to the performance-board connector, receiving the test signal supplied from the performance-board connector, and the daughter board connects the daughter-board connector and the socket.

* * * * *